United States Patent [19]

Mazura

[11] Patent Number: 5,375,724
[45] Date of Patent: Dec. 27, 1994

[54] COMPONENT CARRIER FOR PLUG-IN MODULES

[75] Inventor: Paul Mazura, Karlsbad/Spielberg, Germany

[73] Assignee: Schroff GmbH, Straubenhardt, Germany

[21] Appl. No.: 943,558

[22] Filed: Sep. 11, 1992

[30] Foreign Application Priority Data

Sep. 12, 1991 [DE] Germany ............... 4130355

[51] Int. Cl.$^5$ .............................................. A47F 7/00
[52] U.S. Cl. ........................................ 211/26; 211/41
[58] Field of Search .................... 211/26, 41; 361/415; 403/13, 14, 167, 168

[56] References Cited

U.S. PATENT DOCUMENTS

| | | | |
|---|---|---|---|
| 3,716,760 | 2/1973 | Bertellotti et al. | 211/41 X |
| 4,236,641 | 12/1980 | Marcenne | 211/26 X |
| 4,429,937 | 2/1984 | Stockmaster | 361/415 X |
| 4,486,816 | 12/1984 | Hope | 211/41 X |
| 4,505,392 | 3/1985 | Erlam | 211/26 |
| 4,534,472 | 8/1985 | Hänsller et al. | 211/41 |
| 4,602,829 | 7/1986 | De Andrea | 361/415 X |
| 4,751,612 | 6/1988 | Smith | 211/26 |
| 4,760,495 | 7/1988 | Till | 403/168 X |
| 4,894,753 | 1/1990 | Wadell et al. | 361/415 X |
| 5,135,811 | 8/1992 | Smith et al. | 403/13 X |

FOREIGN PATENT DOCUMENTS 8533398 3/1986 Germany .
8906492 9/1989 Germany .
9010410 10/1990 Germany .

OTHER PUBLICATIONS

"Furturebus+", IEEE NY., Jan. 18th, 1991.

Primary Examiner—Alvin C. Chin-Shue
Assistant Examiner—Korie H. Chan
Attorney, Agent, or Firm—Spencer, Frank & Schneider

[57] ABSTRACT

A component carrier for plug-in modules includes module rails. Each front panel of a plug-in module is provided with a fastening screw and two centering pins at its top and bottom. The front module rails are provided with longitudinal grooves in which are inserted screw strips provided with threaded holes for the fastening screw of the front panel of the plug-in module as well as perforated strips for the centering pins. The perforated strips are seated in front of the screw strips. If the front panel is attached, the short, thick centering pins are seated in the associated centering holes while the long, thin fastening screw passes through the centering hole and is screwed into the respective threaded hole. The arrangement permits the retention of a small distance between the threaded holes in spite of the use of centering pins and permits the use of a small division rate for the component system.

15 Claims, 3 Drawing Sheets

COMPONENT CARRIER FOR PLUG-IN MODULES

CROSS REFERENCE TO RELATED APPLICATION

This application claims the priority of Application Ser. No. P 41 30 355.5, filed Sep. 12, 1991, in the Federal Republic of Germany, the subject matter of which is incorporated herein by reference.

BACKGROUND OF THE INVENTION

The present invention relates to a component carrier for plug-in modules equipped with front panels and including two parallel front module rails and two parallel rear module rails as well as equidistant, threaded holes arranged in a row along each front module rail for screwing on the front panels of the plug-in modules. Each front panel is provided with at least one fastening screw at the top and at the bottom and on its rear face with at least one centering pin in addition to the fastening screw.

The invention is used primarily in component carriers that are closed on all sides for which a very high shielding effect is required with respect to extraneous electromagnetic influences or which contain component groups from which electromagnetic radiation emanates that should not reach the outside or only to a very small degree.

The use of shielded, high frequency tight component carriers and the engineering measures taken in this connection are known. Housings for such components avoid as much as possible any parting grooves between the individual housing components or they are sealed with seals that provide electrical contacts. Problems arise in this connection from the unavoidable gaps between the plug-in modules that can be pushed into and out of such component carriers, whose front panels are in juxtaposition and form the front of the component carrier.

In order to seal the longitudinal gaps between the front panels of the plug-in modules, spring strips are known in various embodiments which, once the plug-in modules have been inserted, establish a plurality of electrical contacts with the longitudinal edges of the respectively adjacent front panels. The drawback is here that the establishment of the contacts and thus the shielding effect becomes considerably poorer after repeated insertion and removal of the plug-in module because the relatively sensitive contact springs are easily bent, exhibit fatigue or are damaged if they are jammed during insertion due to irregularities in the widths of the longitudinal gaps.

It is known to provide alignment pins in addition to fastening screws at the rear faces of the front panels in order to accurately maintain the widths of the longitudinal gaps between adjacent front panels of plug-in modules in component carriers. When the front panel is attached, these alignment pins engage in alignment holes provided at the module rails of the component carrier between the threaded holes for the fastening screws ("Futurebus+", P896.2: Physical Layer and Profile Specifications, Draft 5.497, 5,491, Jan. 22, 1991, Institute of Electrical and Electronic Engineers, Inc., New York, N.Y. 10017, USA). However, this system assumes that component carrier and plug-in module belong to the same standard and the spaces between the threaded holes and the alignment holes are subject to the same grid dimensions as the width of the front panels. Plug-in modules of other standards or front panels having a width that differs from the grid spacing cannot be employed. A particular drawback in this connection is the coarse grid spacing which permits no intermediate steps with respect to the widths of the front panels and is produced solely by the relatively large distance between two threaded holes, inevitably caused by the large alignment hole inserted therebetween.

Additionally, a component carrier for plug-in modules is known in which the front module rails are provided with screw strips for screwing on the front panels, with alignment pins projecting from the rear face of the front panel. These alignment pins are pressed into the threaded holes of the screw strips when the front panel is attached. In this connection it has been found, however, that after repeated insertion or exchange of the plug-in modules, the threads are damaged by the alignment pins and small metal chips are torn off which makes screwing on the front panels and their alignment more difficult (DE 90 10 410 U1).

SUMMARY OF THE INVENTION

It is an object of the invention to design a component carrier for plug-in modules having front panels equipped with fastening screws and centering pins in which, although the threaded holes for the fastening screws are spaced close together, damage to the threads from the centering pins is excluded.

To solve the problem at hand, the invention is based on a component carrier for plug-in modules equipped with front panels and including pairs of parallel front and rear module rails provided with a row of equidistant threaded holes along each front module rail for screwing on the front panels of the plug-in modules, with each front panel being provided with at least one fastening screw at the top and bottom and on its rear face with at least one centering pin in addition to the fastening screw. The problem is solved in that a row of equidistant centering holes arranged coaxially with the threaded holes is provided in front of the threaded holes for the centering pins; the diameter of the centering pins and of the associated centering holes is greater than the thread diameter of the fastening screws; and the centering pins are shorter than the fastening screws. Since it is ensured in this way that the centering pins are able to enter an operative connection only with the centering holes, damage to the threaded holes for the fastening screws is not possible.

The solution concept lies particularly in that the threaded holes and the centering holes are not—as in the prior art—arranged in a row next to one another but in a space saving manner one behind the other. This results in the advantage that the grid pattern can be kept small. It thus depends essentially only on the diameter of the threaded holes and their distance from one another. The 5.08 mm grid pattern (corresponding to one division unit TE) applicable for the spacing of the threaded holes in 19″ units can remain unchanged if the present invention is employed. The arrangement of centering holes between the threaded holes according to the prior art, however, would lead to the division units TE almost being doubled. Looking at it in another way, the proposal of providing the centering holes in front of the threaded holes permits the use of centering pins at the front panel of plug-in modules of a component system having an already existing very close grid pattern (small TE) without it being necessary to enlarge it.

In a preferred embodiment of the invention, the threaded holes are provided in a screw strip and the centering holes in a perforated strip. In each module rail, the screw strip as well as the perforated strip are inserted into and fastened in a profiled longitudinal groove that is open toward the front panel. This measure facilitates the production of the component carrier equipped according to the invention.

The screw strip may be provided behind the perforated strip in a pair of opposing holding grooves provided within the longitudinal groove. This embodiment is relatively easy to realize from an engineering point of view.

According to another preferred feature to be employed, the longitudinal groove of the two front module rails is provided with two pairs of facing holding grooves and the perforated strip is seated in the two front holding grooves adjacent to the front panels while the screw strip is seated in the two rear holding grooves. This has the advantage that the module rails employed in a 19" component system whose dimensions are standardized can be employed because they are already equipped with the rear holding grooves and it is only necessary to apply the two front holding grooves between the rear holding grooves and the front edge. These additional front holding grooves may be kept narrow so that the available space is sufficient.

The screw strip and the perforated strip may also be made in one piece and may be inserted into a single pair of facing holding grooves.

The centering pins are advisably configured to have a cylindrical shank and a conical tip and accordingly the centering holes will have a cylindrical configuration.

For reasons of expedient manufacture, it will be advantageous for the screw strip, the perforated strip and the holding grooves to be given corresponding, rectangular cross sections.

BRIEF DESCRIPTION OF THE DRAWINGS

The invention will now be described in greater detail for an embodiment thereof and with reference to the three attached sheets of drawings, in which.

DETAILED DESCRIPTION OF THE PREFERRED EMBODIMENT

Figure 1:
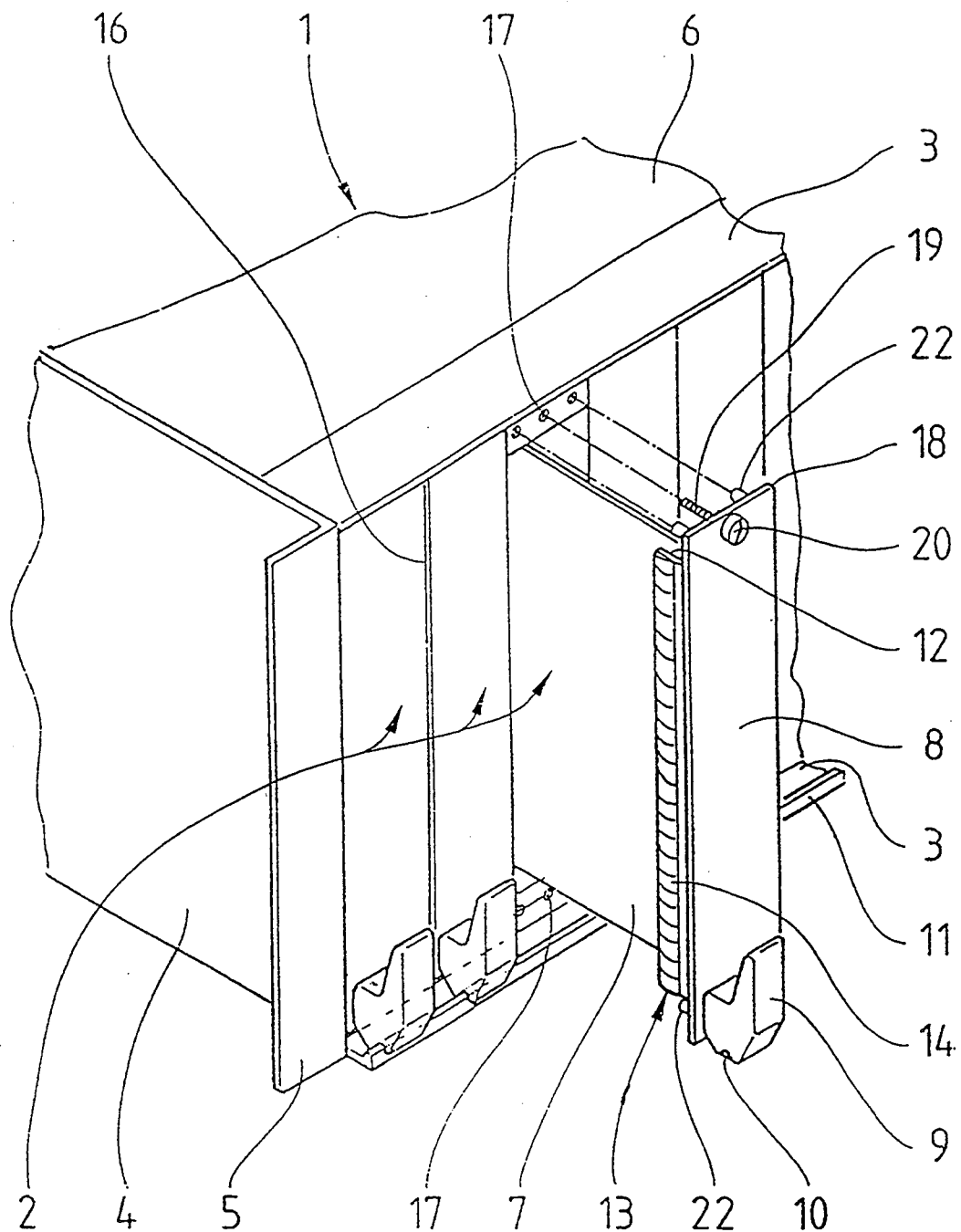
FIG. 1 is a perspective view of part of a component carrier that is equipped with a plurality of plug-in modules, with one of the plug-in modules being in a partially pulled-out position.

A component carrier 1 provided to accommodate plug-in modules 2 includes two front module rails 3 and two rear module rails, (not visible). These four module rails 3 which are made of aluminum profiles and are arranged parallel to one another and in a horizontal plane, connect the two side walls 4 of component carrier 1 which are equipped with holding strips 5 that are bent at an angle at the front and serve to fasten the component carrier 1 in an equipment cabinet (not shown) or the like. Component carrier 1 together with side walls 4, a top 6 and a rear wall as well as a bottom (the latter two not visible) is tightly sealed against high frequencies, with suitable measures being taken at the abutting edges of all components forming component carrier 1 to ensure a tight seal.

Each plug-in module 2 is essentially composed of a circuit board 7 and a front panel 8. Circuit board 7 is equipped with electronic and electrical components that are interconnected by means of metal conductor paths. With the aid of plug-in connections and a rear wall plate, the plug-in modules are in communication with one another within the component carrier. Each circuit board 7 is guided in guide rails that extend between the front and rear module rails 3. The front edge of circuit board 7 is fastened at a right angle to a front panel 8 which is provided at the bottom of its frontal face with a pivotal removal handle 9 that cooperates by means of a groove 10 with a removal edge 11 in the lower front module rail 3 when plug-in module 2 is pulled out (and also when it is inserted).

Figure 2:
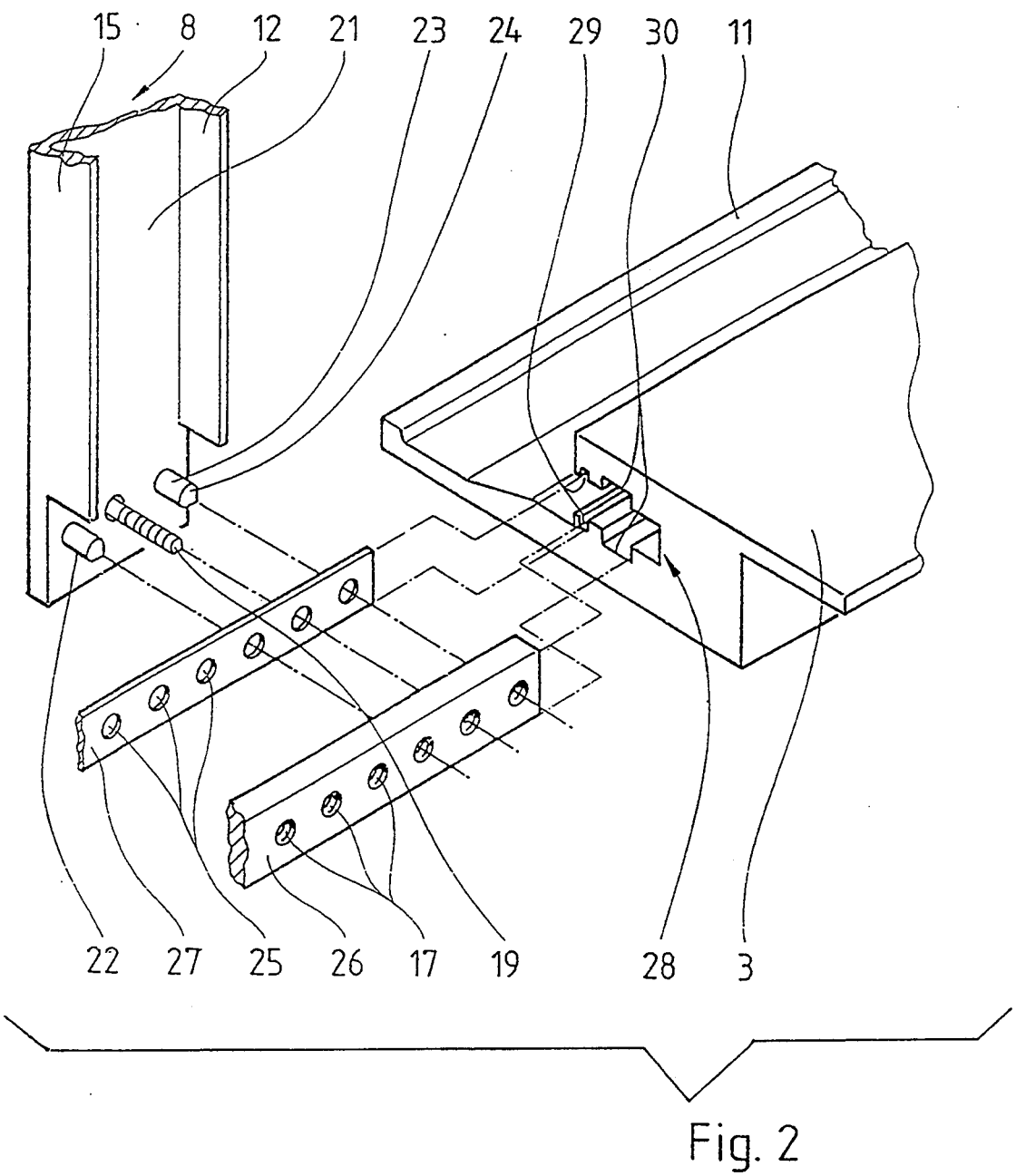
FIG. 2 is a perspective front view of part of a front module rail of the component carrier according to FIG. 1, including a screw strip and a perforated strip in the pushed-out position and also showing the front panel of a plug-in module.
Figure 3:
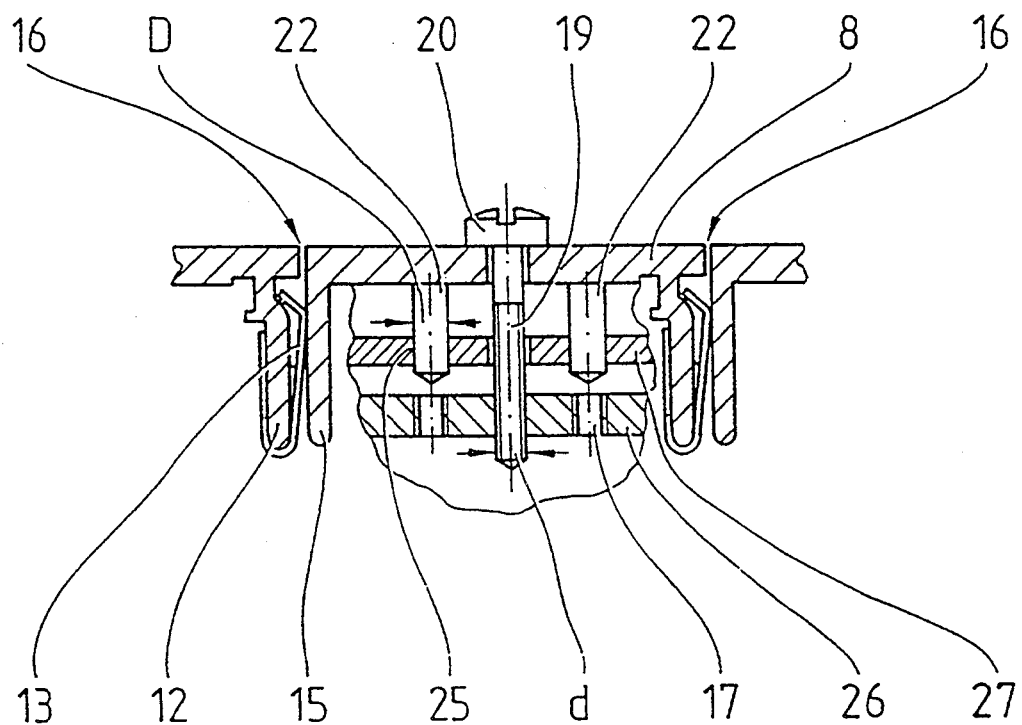
FIG. 3 is a partial horizontal sectional view of a front panel arrangement of the plug-in module of the component carrier of FIG. 1.

Front panel 8 has a U-shaped cross section (see also FIG. 2) and is provided at one of its long sides 12 with a spring contact strip 13 equipped with a plurality of closely spaced elastic spring leaves 14 which, when plug-in module 2 is inserted, lay themselves against the smooth long side 15 of the adjacent front panel 8 facing them (see FIG. 3). They establish a row of electrical contacts, thus preventing the escape as well as the inward penetration of electromagnetic, high frequency interfering fields through the longitudinal gaps 16 disposed between front panels 8.

A row of longitudinal, equidistant threaded holes 17 is provided at each one of the two front module rails 3 to enable the front panels 8 of the plug-in modules 2 to be screwed to module rails 3. For this purpose, each front panel is provided at its top and bottom near its transverse edges 18 with a fastening screw 19 having a slotted screw head 20. Fastening screw 19 passes through front panel 8 and can be screwed into the respective threaded hole 17 provided or selected for this purpose.

Two centering pins 22 project vertically at the rear face of each front panel 8. These centering pins have a cylindrical shank 23 and a conical tip 24.

A row of equidistant centering holes 25 that are coaxial with threaded holes 17 are provided in front of the threaded holes 17 for fastening screws 19. Each centering hole 25 has a cylindrical configuration and is intended for the accurately fitting accommodation of a centering pin 22. These centering pins 22 also serve to absorb lateral forces.

Threaded holes 17 are disposed (see FIG. 2) in a screw strip 26 and centering holes 25 are disposed in a perforated strip 27. This screw strip 26 as well as this perforated strip 27 are inserted from the end face of module rail 3 into a longitudinal groove 28 therein and are there fastened in a suitable manner—for example, with the aid of headless screws—and are secured against displacement. This longitudinal groove 28 is profiled and open toward the front panel 8 that is to be screwed on.

In order to accommodate screw strip 26 and perforated strip 27, longitudinal groove 28 is given the cross section of a so-called "patriarchal cross" that is it has two pairs of oppositely directed holding grooves which have rectangular cross sections that correspond with the respective screw strip 26 and with perforated strip 27. The thin perforated strip 27 is inserted into the two front holding grooves 29 adjacent to front panel 8 and the thick screw strip 26 is inserted into the two rear holding grooves 30.

The diameter D of centering pins 22 and of the centering holes 25 provided to receive them is greater than the diameter d of the thread of fastening screw 19, that is, fastening screw 19 can be screwed through the centering hole 25—which is disposed in front of threaded hole 17—into the respective threaded hole 17. Centering pins 22 are shorter than fastening screws 19; they have such dimensions that, with a front panel 8 fastened to module rail 3, the two centering pins 22 lie in their associated centering holes 25 in perforated strip 27 or, more precisely, pass through them somewhat, but the tips 24 of centering pins 22 are unable to come in contact with the respective threaded hole 17 disposed in screw strip 26 behind the respective centering hole 25. The fastening screw 19 seated between the two centering pins 22, however, passes unimpededly through the centering hole 25 on its longitudinal axis and is seated in the threaded hole 17 intended for it in the screw strip 26 disposed behind perforated strip 27.

In an embodiment that is not shown in the drawings, the screw strips 26 lie behind the perforated strips 27 in a single correspondingly broad pair of oppositely disposed holding grooves provided in longitudinal groove 28. In that case, screw strip 26 and perforated strip 27 may also be made of one piece and may together form a correspondingly thick insertable strip. In individual cases, longitudinal groove 28 may also be omitted in the front module rails 3; the threaded holes 17 are then drilled directly into module rails 3 and a corresponding centering hole 25 is provided in front of each threaded hole 17.

It will be understood that the above description of the present invention is susceptible to various modifications, changes and adaptations, and the same are intended to be comprehended within the meaning and range of equivalents of the appended claims.

What is claimed is:

1. A component carrier in combination with at least one plug-in module, the module including a front panel having a fastening screw of a first length and a rear face with a centering pin of a second length, the second length being less that the first length, the carrier comprising:

a module rail having a row of threaded holes arranged along the module rail, each threaded hole being arranged equidistant from adjacent threaded holes and being adapted for receiving the fastening screw of the front panel of a module, and a row of centering holes disposed in front of and coaxial with the threaded holes, each centering hole being arranged equidistant from adjacent centering holes and being adapted for receiving the centering pin of the rear face of the front panel of a module, a diameter of the centering pin and of the centering holes being greater than a thread diameter of the fastening screw.

2. A component carrier and plug-in mode combination according to claim 1, wherein the module rail includes a longitudinal groove having an opening toward the rear face of the front panel;

the threaded holes being provided in a screw strip;
   the centering holes being provided in a perforated strip; and
   the screw strip and the perforated strip being fastened in the longitudinal groove.

3. A component carrier and plug-in module combination according to claim 2, wherein the longitudinal groove includes a pair of facing holding grooves, the perforated strip being disposed in the groove at the opening and the screw strip is disposed behind the perforated strip.

4. A component carrier and plug-in module combination according to claim 3, wherein the screw strip and the perforated strip are formed from one piece.

5. A component carrier and plug-in module combination according to claim 2, wherein the longitudinal groove includes a front pair of oppositely directed holding grooves and a rear pair of oppositely directed holding grooves, the front pair of holding grooves being disposed closer to the front panel of the plug-in module than the rear pair of holding grooves when the carrier is holding the module, and wherein the perforated strip is seated in the front pair of holding grooves and the screw strip is seated in the rear pair of holding grooves.

6. A component carrier and plug-in module combination according to claim 2, wherein the screw strip, the perforated strip and the holding grooves have mutually corresponding, rectangular cross sections.

7. A component carrier and plug-in module combination according to claim 1, wherein each centering pin has a cylindrical shank and a conical tip.

8. A component carrier and according to claim 1, wherein a distance between the fastening screw and the centering pin equals the equidistant arrangement of the threaded holes.

9. A component carrier for holding plug-in modules, each plug-in module including a front panel with a rear face having a centering pin and a fastening screw, the carrier comprising:

a module rail having a row of threaded holes arranged equidistant from adjacent threaded holes along the rail and a row of centering holes disposed in front of and coaxial with the threaded holes,
   each threaded hole being adapted for receiving the fastening screw of the front panel of a plug-in module, and each centering hole being adapted for receiving the centering pin of the rear face of the front panel of the module; wherein each of said module rail includes a longitudinal groove having an open end and a closed end, the open end oriented toward an outer surface of each respective one of said rail;
   a screw strip and a perforated strip;
   the threaded holes being provided in the screw strip;
   the centering holes being provided in the perforated strip; and the screw strip and the perforated strip being fastened in the longitudinal groove.

10. A component carrier according to claim 9, wherein a diameter of the centering holes is greater than a thread diameter of the fastening screw.

11. A component carrier according to claim 9, wherein the longitudinal groove further includes a pair of facing holding grooves, the perforated strip being disposed in the groove at the open end of the longitudinal groove and the screw strip is disposed at the closed end of the longitudinal groove.

12. A component carrier according to claim 11, wherein the screw strip and the perforated strip are formed from one piece.

13. A component carrier according to claim 9, wherein the longitudinal groove includes a first pair of oppositely directed holding grooves at the open end of the longitudinal groove and a second pair of oppositely directed holding grooves at the closed end of the longitudinal groove, and wherein the perforated strip is seated in the first pair of holding grooves and the screw strip is seated in the second pair of holding grooves.

14. A component carrier according to claim 9, wherein the screw strip, the perforated strip and the holding grooves have mutually corresponding, rectangular cross sections.

15. A component carrier according to claim 9, wherein the equidistant arrangement of the threaded holes equals a distance between the fastening screw and the centering pin of the module.

* * * * *